(12) United States Patent
Koh et al.

(10) Patent No.: US 9,218,874 B1
(45) Date of Patent: Dec. 22, 2015

(54) MULTI-PULSE PROGRAMMING CYCLE OF NON-VOLATILE MEMORY FOR ENHANCED DE-TRAPPING

(71) Applicant: SanDisk Technologies Inc., Plano, TX (US)

(72) Inventors: Yee Lih Koh, Fremont, CA (US); Tien-chien Kuo, Sunnyvale, CA (US); Man Mui, Fremont, CA (US); Juan Lee, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/456,853

(22) Filed: Aug. 11, 2014

(51) Int. Cl.
*G11C 11/34* (2006.01)
*G11C 11/56* (2006.01)
*G11C 16/34* (2006.01)
*G11C 16/04* (2006.01)
*G11C 16/10* (2006.01)

(52) U.S. Cl.
CPC ........ *G11C 11/5628* (2013.01); *G11C 16/0483* (2013.01); *G11C 16/10* (2013.01); *G11C 16/3459* (2013.01)

(58) Field of Classification Search
CPC .............. G11C 16/0483; G11C 16/10; G11C 11/5628; G11C 16/3454; G11C 16/12; G11C 16/107; G11C 2213/71
USPC ........................... 365/185.03, 185.17–185.22
See application file for complete search history.

(56) References Cited

U.S. PATENT DOCUMENTS

| | | | |
|---|---|---|---|
| 6,671,207 B1 | 12/2003 | Parker | |
| 8,659,951 B2 * | 2/2014 | Nawata | .................. G11C 16/10 365/184 |
| 2008/0225595 A1 | 9/2008 | Choi et al. | |
| 2009/0273978 A1 | 11/2009 | Fukuda | |
| 2012/0275223 A1 | 11/2012 | Baek | |

OTHER PUBLICATIONS

U.S. Appl. No. 13/925,662, filed Jun. 24, 2013, 36 pages.
International Search Report and Written Opinion issued in International Patent Application No. PCT/US2015/042504, mailed Oct. 6, 2015, 11 pages.

* cited by examiner

*Primary Examiner* — David Lam
(74) *Attorney, Agent, or Firm* — Davis Wright Tremaine LLP

(57) ABSTRACT

When writing a multi-state non-volatile memory, a de-trapping operation is included in the programming cycle. To reduce the performance penalty of including a de-trapping operation, the programming cycle of a single series of increasing pulses alternating with verify operations is replaced with a cycle including a pulse from each of two or more staircases, where each staircase is for a corresponding subset of the data states. After the multiple pulses, but before the following verify, a de-trapping operation is inserted in the programming cycle.

15 Claims, 15 Drawing Sheets

Programming into four states represented by a 2-bit code

FIG. 19

| FINE | 0.3 |
|---|---|
| # prog pulse | 23 |
| # reverse pulse | 23 |
| # of A-verify | 11 |
| PCV_B3 | 2 |
| # of B-verify | 11 |
| PCV_C3 | 4 |
| # of C-verify | 11 |
| PCV_D3 | 7 |
| # of D-verify | 10 |
| PCV_E3 | 8 |
| # of E-verify | 11 |
| PCV_F3 | 11 |
| # of F-verify | 11 |
| PCV_G3 | 13 |
| # of G-verify | 11 |

| fine_step | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
|  | A | A | A | A | A | A | A | A | A | A | A |  |  |  |  |  |  |  |  |  |  |  |  |  |  |
|  |  |  | B | B | B | B | B | B | B | B | B | B | B |  |  |  |  |  |  |  |  |  |  |  |  |
|  |  |  |  |  | C | C | C | C | C | C | C | C | C | C | C |  |  |  |  |  |  |  |  |  |  |
|  |  |  |  |  |  |  |  | D | D | D | D | D | D | D | D | D | D |  |  |  |  |  |  |  |  |
|  |  |  |  |  |  |  |  |  | E | E | E | E | E | E | E | E | E | E | E |  |  |  |  |  |  |
|  |  |  |  |  |  |  |  |  |  |  |  | F | F | F | F | F | F | F | F | F | F | F |  |  |  |
|  |  |  |  |  |  |  |  |  |  |  |  |  |  | G | G | G | G | G | G | G | G | G | G | G |  |
| #R_CLK | 1 | 2 | 2 | 3 | 3 | 3 | 4 | 5 | 5 | 5 | 6 | 5 | 5 | 4 | 4 | 4 | 3 | 3 | 2 | 2 | 2 | 1 | 1 | 0 | 0 |
| #RWL_CLK | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 |

FIG. 20

| | |
|---|---|
| FINE | 0.3 |
| # prog pulse | 32 |
| # reverse pulse | 16 |
| # of A-verify | 11 |
| PCV_B3 | 2 |
| # of B-verify | 11 |
| PCV_C3 | 4 |
| # of C-verify | 11 |
| PCV_D3 | 7 |
| # of D-verify | 10 |
| PCV_E3 | 1 |
| # of E-verify | 11 |
| PCV_F3 | 4 |
| # of F-verify | 11 |
| PCV_G3 | 6 |
| # of G-verify | 11 |

| fine_step | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| | | A | A | A | A | A | A | A | A | A | A | | | | | | | | | | | | | | |
| | | | | B | B | B | B | B | B | B | B | | | | | | | | | | | | | | |
| | | | | | | C | C | C | C | C | C | C | | | | | | | | | | | | | |
| | | | | | | | | D | D | D | D | D | D | | | | | | | | | | | |
| | E | E | E | E | E | E | E | E | E | E | E | | | | | | | | | | | | | | |
| | | | | | F | F | F | F | F | F | F | | | | | | | | | | | | | | |
| | | | | | | G | G | G | G | G | G | G | G | | | | | | | | | | | | |
| #R_CLK | 2 | 3 | 5 | 5 | 5 | 6 | 7 | 7 | 7 | 5 | 4 | 4 | 4 | 2 | 2 | 1 | 1 | 1 | 0 | 0 | 0 | 0 | 0 | 0 | 0 |
| #RWL_CLK | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 |

MULTI-PULSE PROGRAMMING CYCLE OF NON-VOLATILE MEMORY FOR ENHANCED DE-TRAPPING

BACKGROUND

This application relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

A first set of aspects relate to a method of performing a write operation in a non-volatile memory circuit having an array of non-volatile, multi-state memory cells. The write operation on is performed on a plurality of memory cells formed along a first word line from a first state to one of a plurality of second states, the second states including a first subset of one or more memory states and a second subset of one or more memory states, where the threshold voltages of the states of the second subset are higher that the threshold voltages of the states of the first subset. The method includes performing a sequence of one or more programming cycles, where a cycle includes applying first and second programming pulses, performing a de-trap operation, and performing a verify operation. The first programming pulse is applied to the first word line while program inhibiting non-selected cells along the first word line, program inhibiting selected cells along the first word line to be programmed to a state of the second subset, and program enabling selected cells along the first word line to be programmed to a state of the first subset. The second programming pulse is subsequently applied to the first word line while program inhibiting non-selected cells along the first word line, program inhibiting selected cells along the first word line to be programmed to a state of the first subset, and program enabling selected cells along the first word line to be programmed to a state of the second subset. A de-trap operation is then performed on the selected cells along the first word line of both subsets, after which a verify operation is performed on\ the selected cells along the first word line of both sets, wherein those of the cells that successfully verify are inhibited prior to performing the nest cycle of the sequence.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 19 and 20 respectively illustrate examples of the states verified in a single pulse and a double pulse program cycle.

DETAILED DESCRIPTION

Memory System

Figure 1:
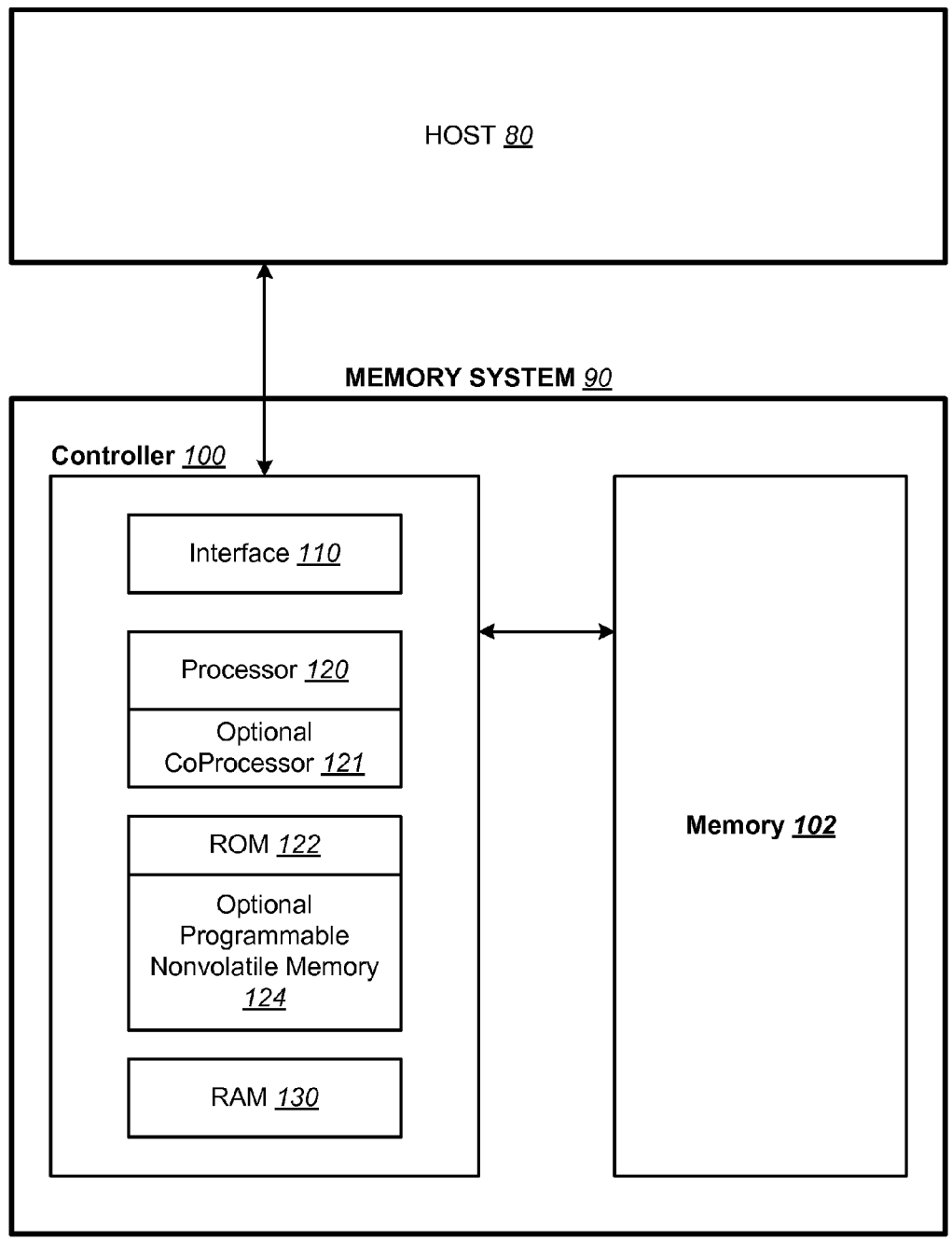
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Physical Memory Structure

Figure 2:
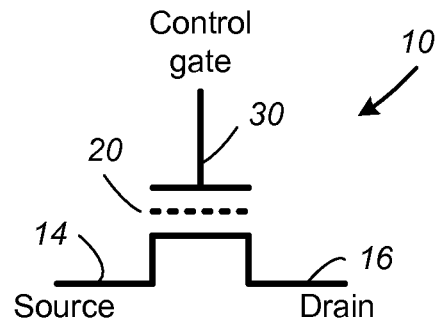
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
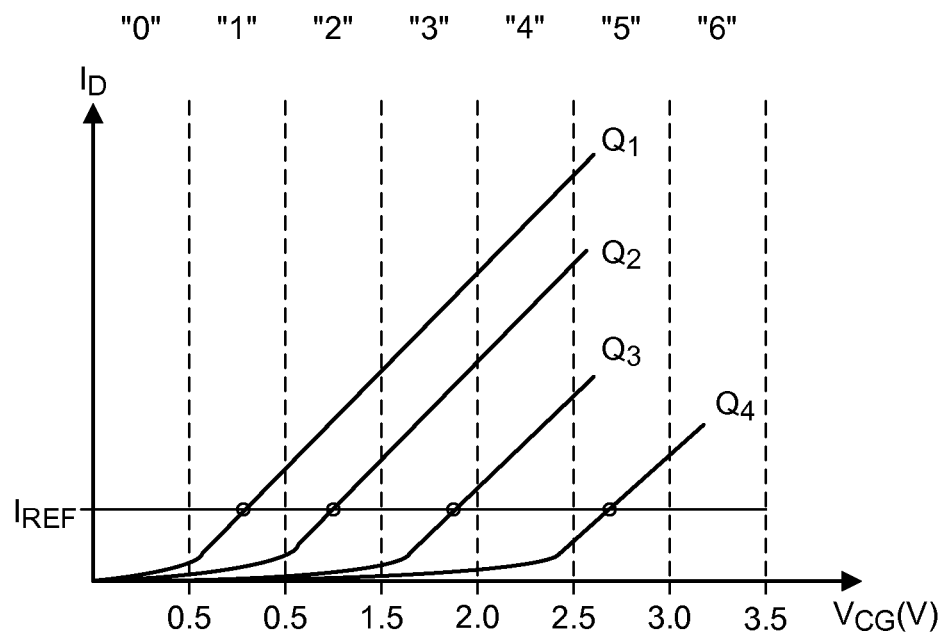
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
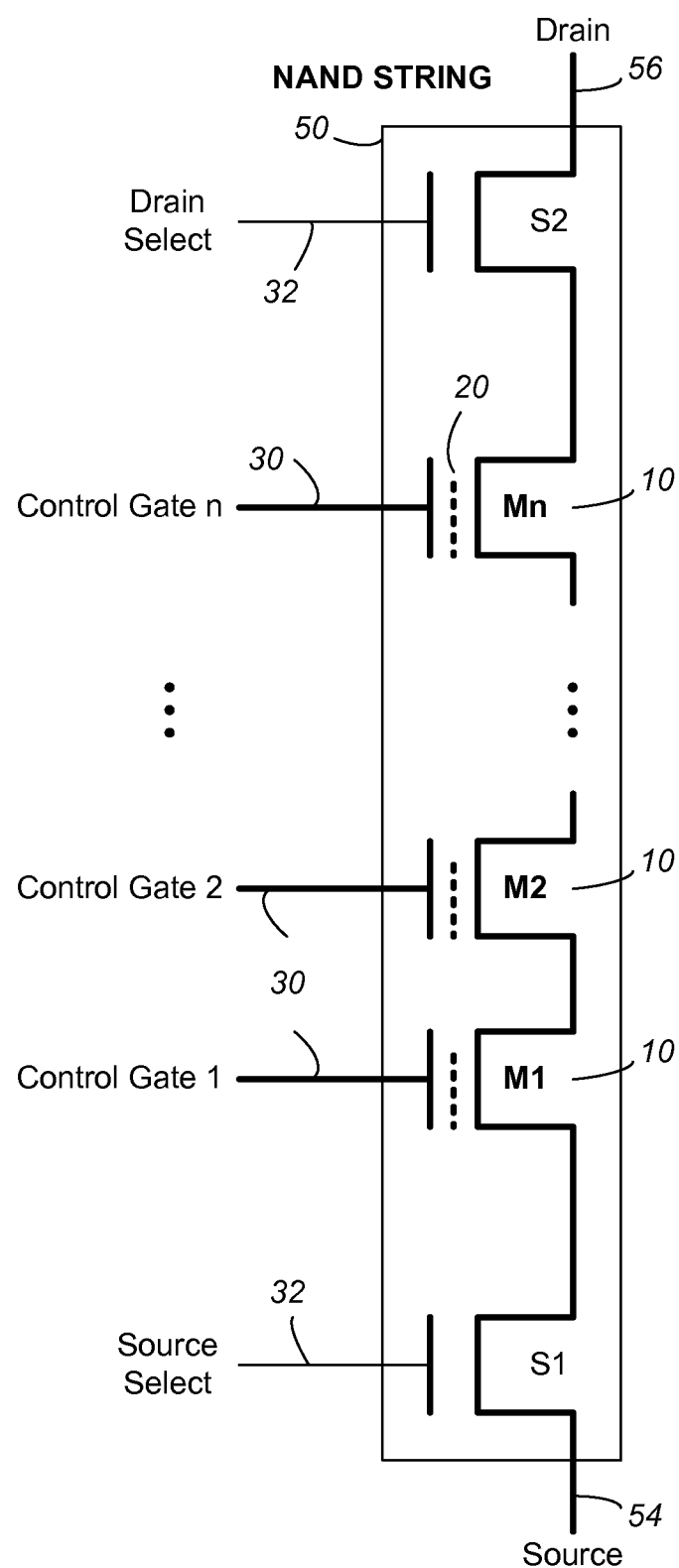
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5:
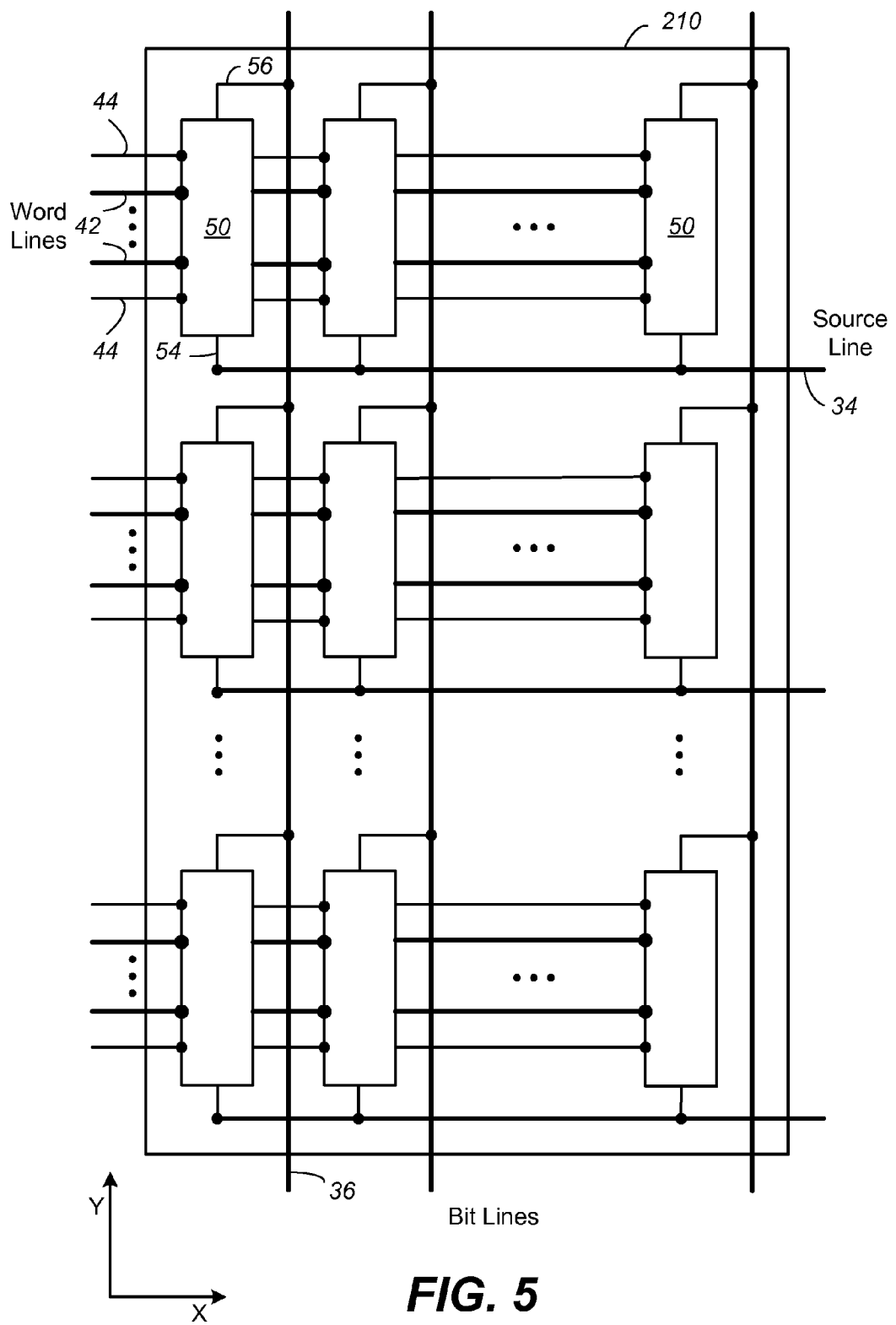
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
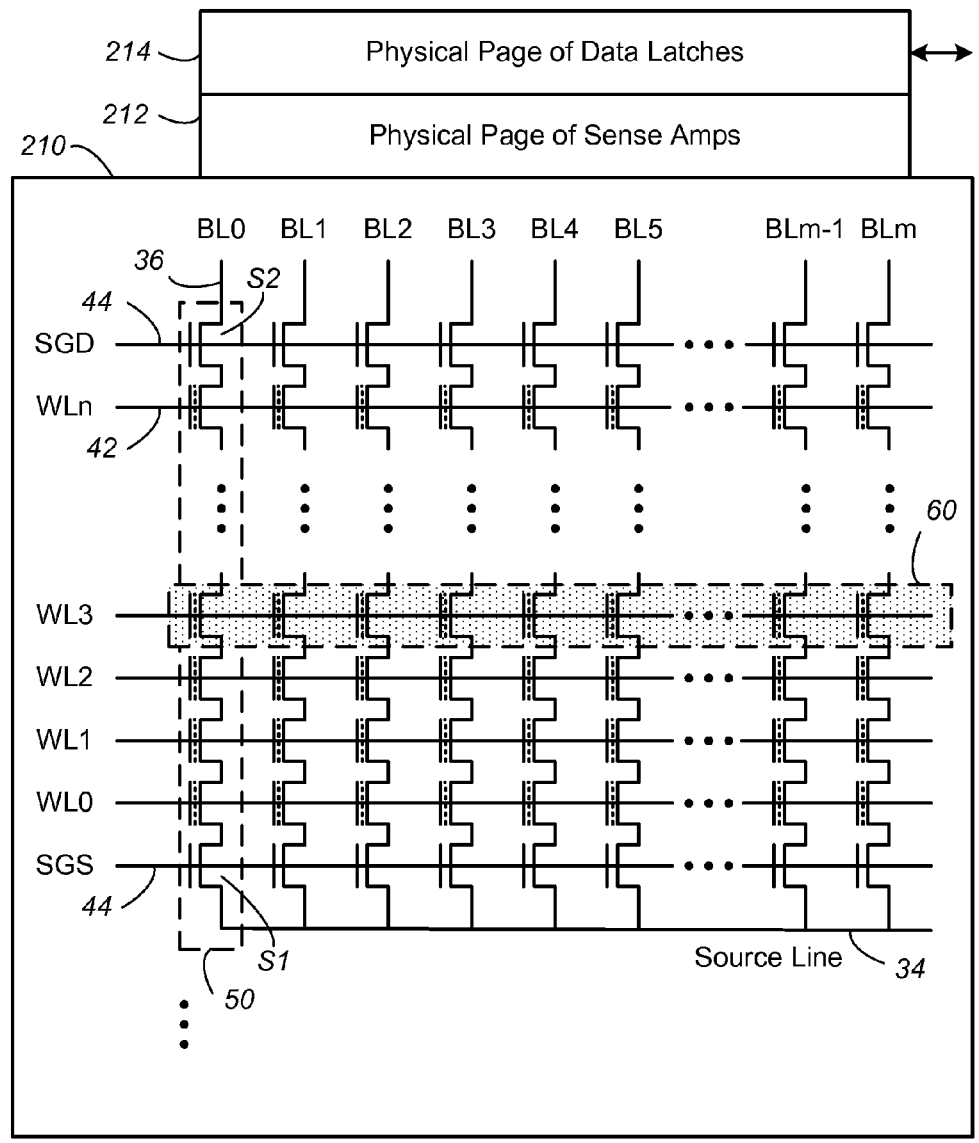
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
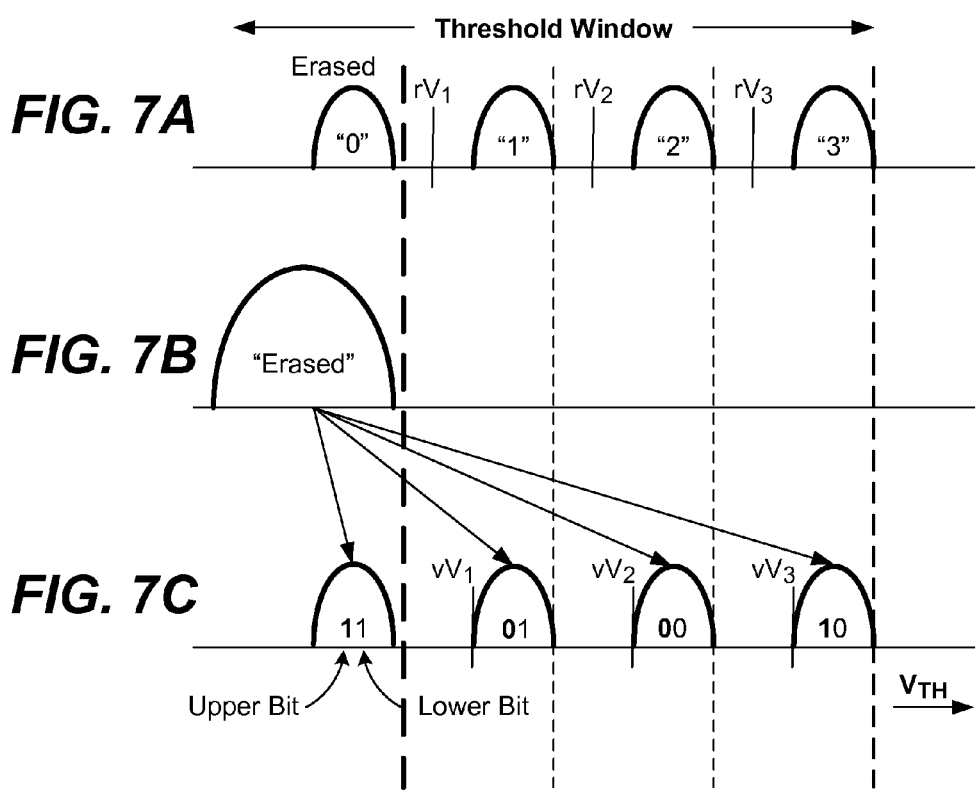
FIGS. 7A-7C illustrate an example of programming a population of memory cells.

FIGS. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 7C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 8:
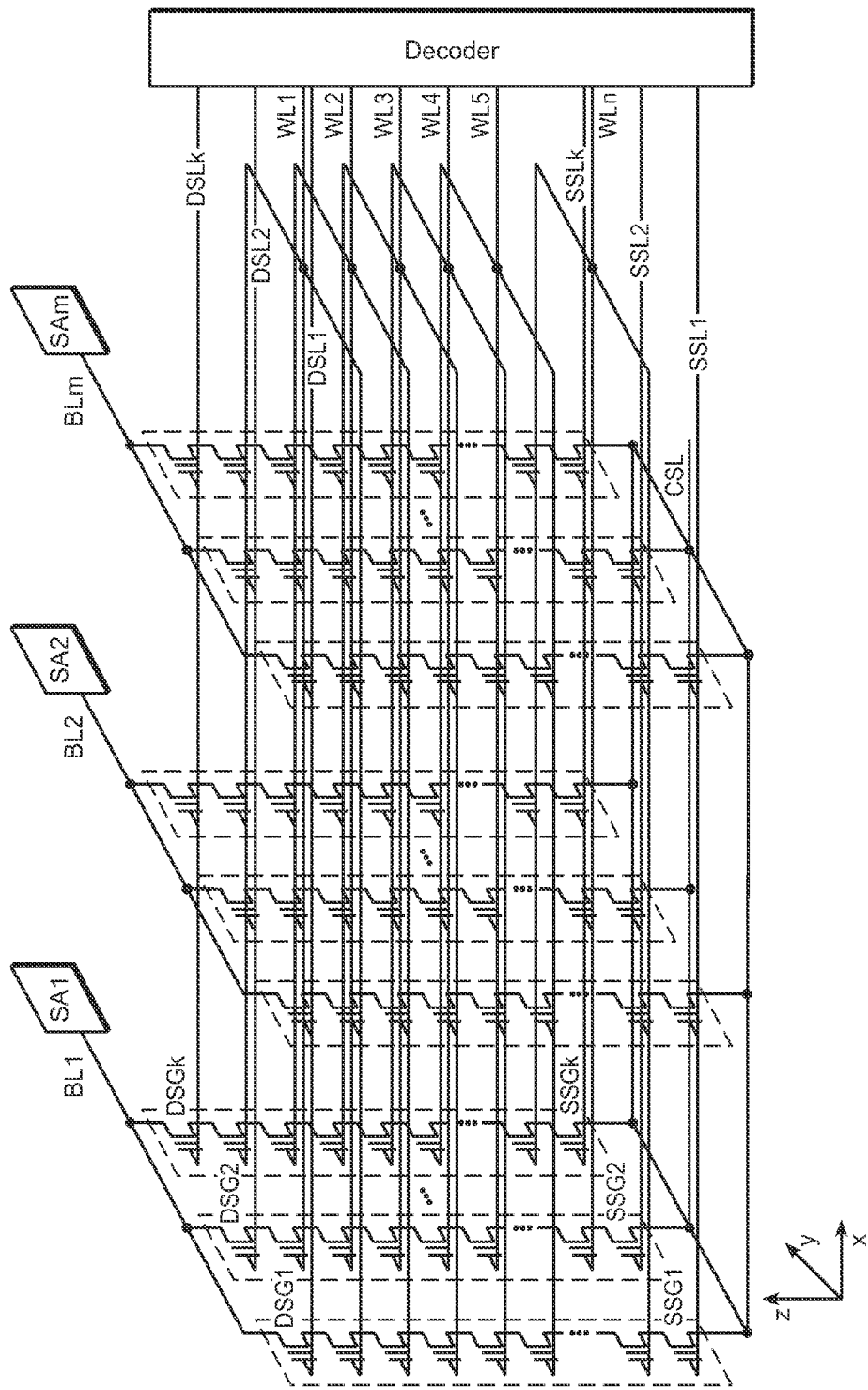
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
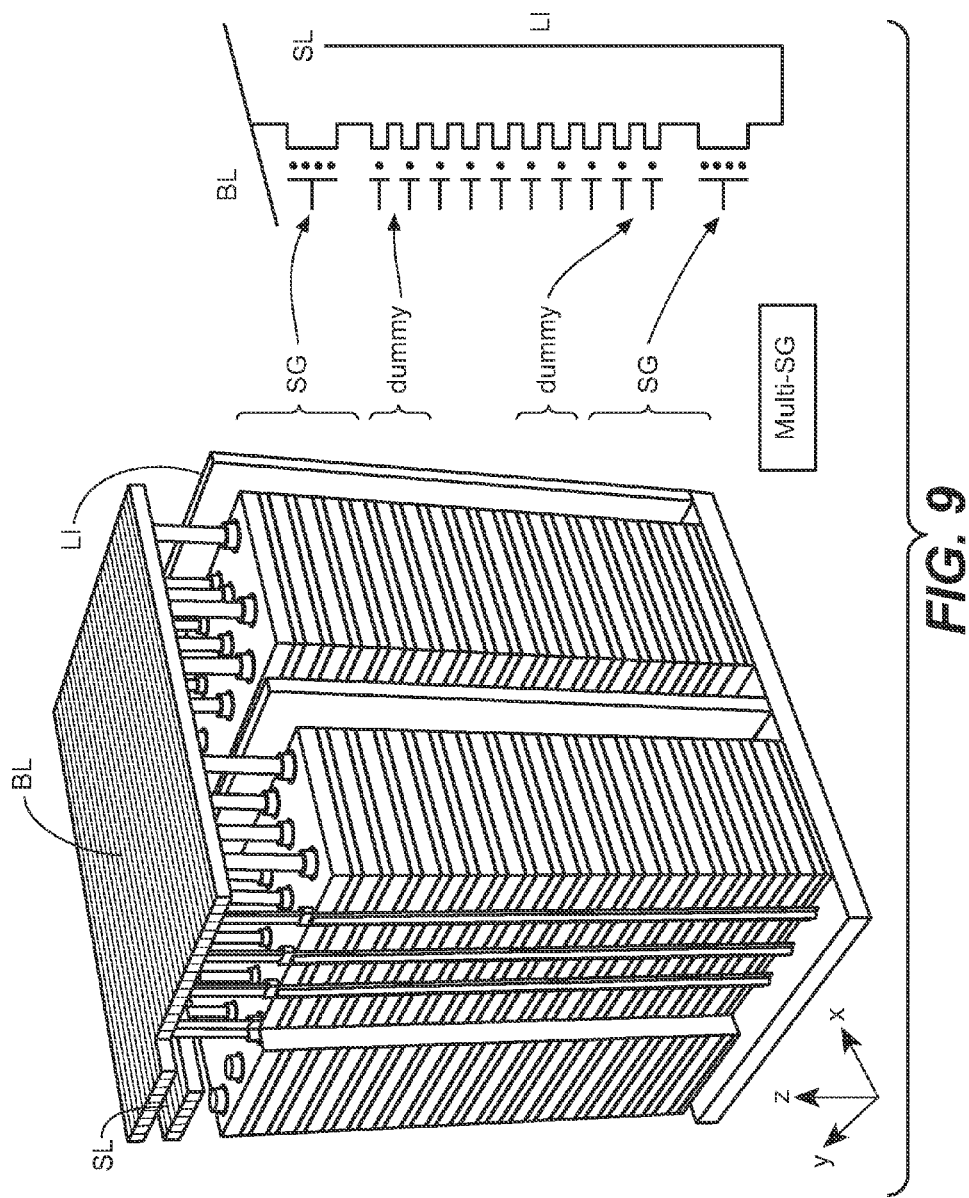
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up, such as is described in U.S. patent application Ser. No. 13/927,659, filed on Jun. 26, 2013.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted, aspects of which are described in US patent publication number 2014-0169095. This exemplary embodiment also includes several dummy cells at the ends that are not used to store user data, as their proximity to the select gates makes them more prone to disturbs.

Figure 10:
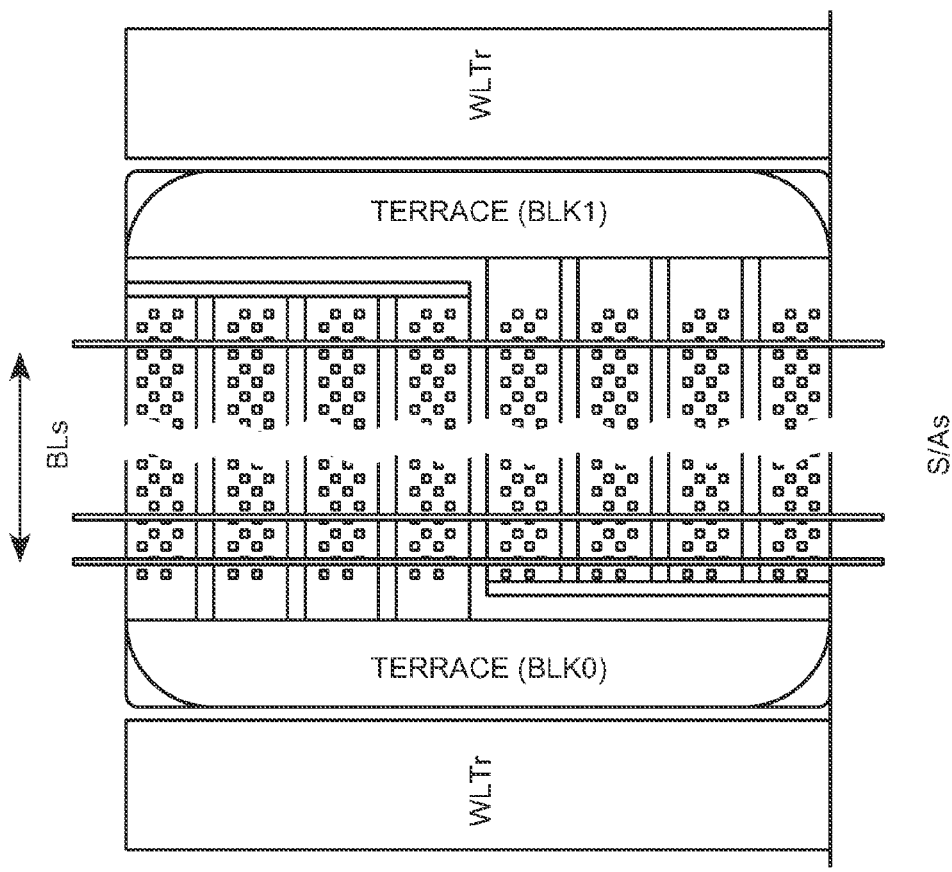

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
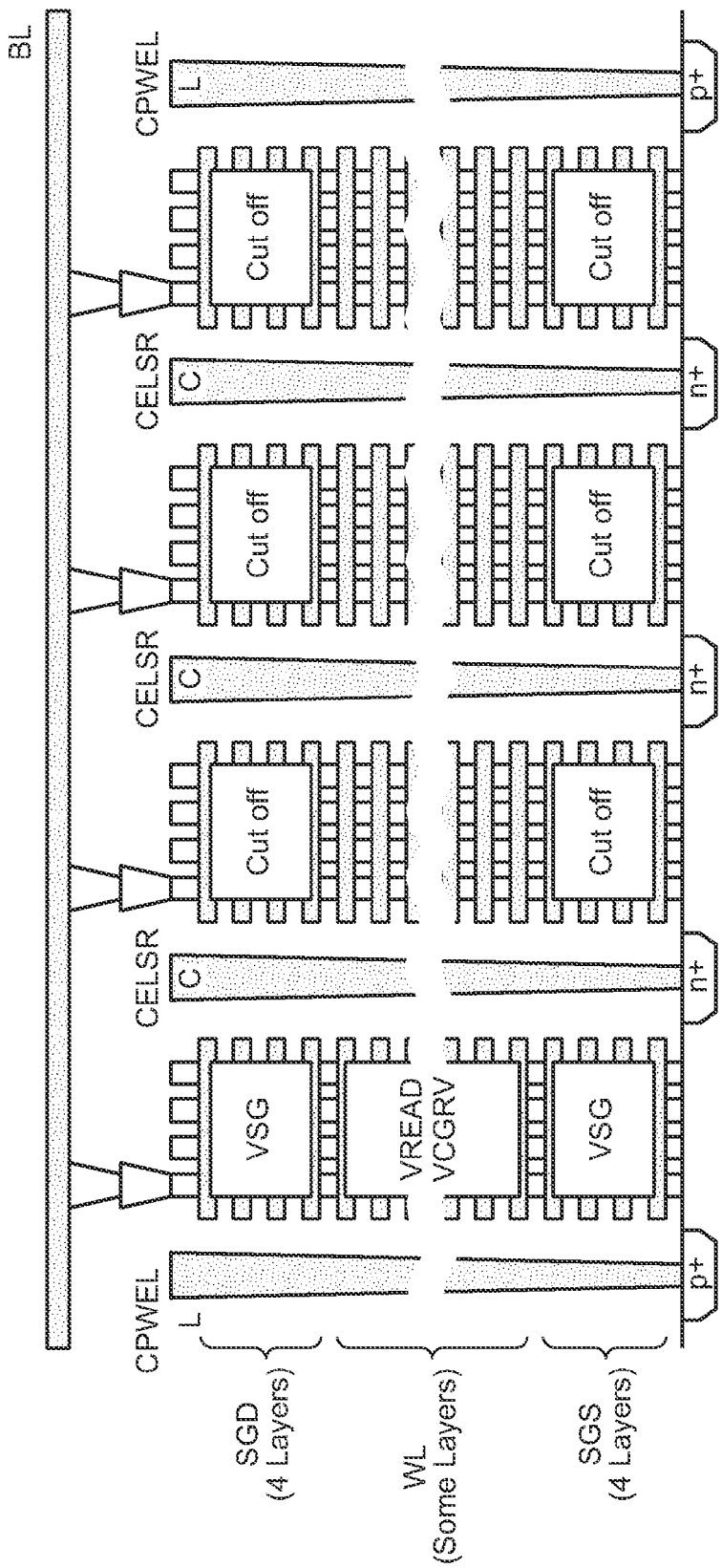

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
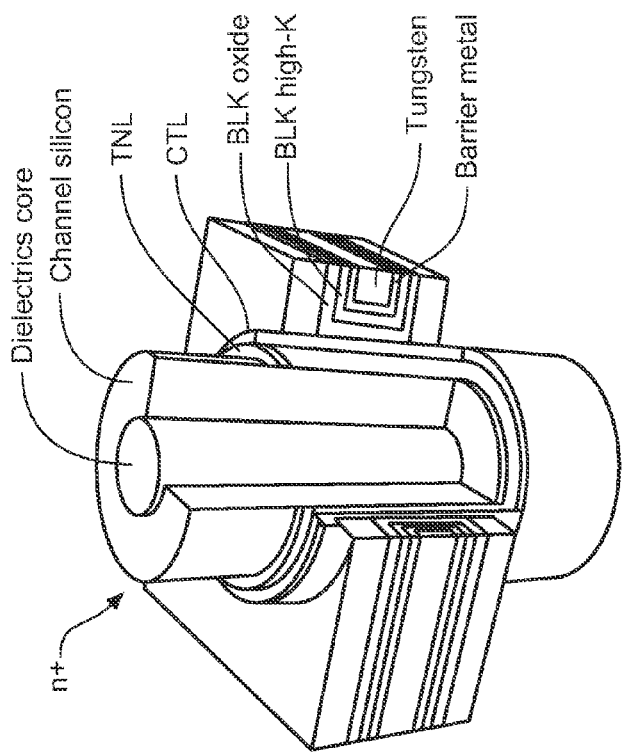

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Multi-Pulse Program for Enhanced De-Trap Pulse Performance

As noted above with respect to FIGS. 7A-7C, one method of programming a page is full-sequence programming. All cells of the page are initially in an erased state ("0" or "Er"). Thus, all cells of the page are programmed in parallel from the erased state towards their target states. Those memory cells with "1" (or "A") state as a target state will be prohibited from further programming once they have been programmed to the "1" state while other memory cells with target states "2" (or "B") or higher will be subject to further programming. Eventually, the memory cells with "2" as a target state will also be locked out from further programming. Similarly, with progressive programming pulses the cells with target states "3"-"7" (or "C"-"G") are reached and locked out.

Since a verifying take place after a programming pulse and each verifying may be relative to a number of verify levels, various "smart" verifying schemes have been implemented to reduce the total number of verifying operations. For example, since the pulse by pulse programming increasingly programs the population of cells towards higher and higher threshold levels, verifying relative to a higher verify level needs not start until a certain pulse; similarly, the verification of lower levels can be sequentially discontinued after a number of pulses. An example of a programming technique with smart verify is disclosed in U.S. Pat. No. 7,243,275, "Smart Verify for Multi-State Memories" by Gongwer et al., issued 10 Jul. 2007, and assigned to the same assignee as the present application. The entire disclosure of U.S. Pat. No. 7,243,275 is incorporated herein by reference.

Figure 13:
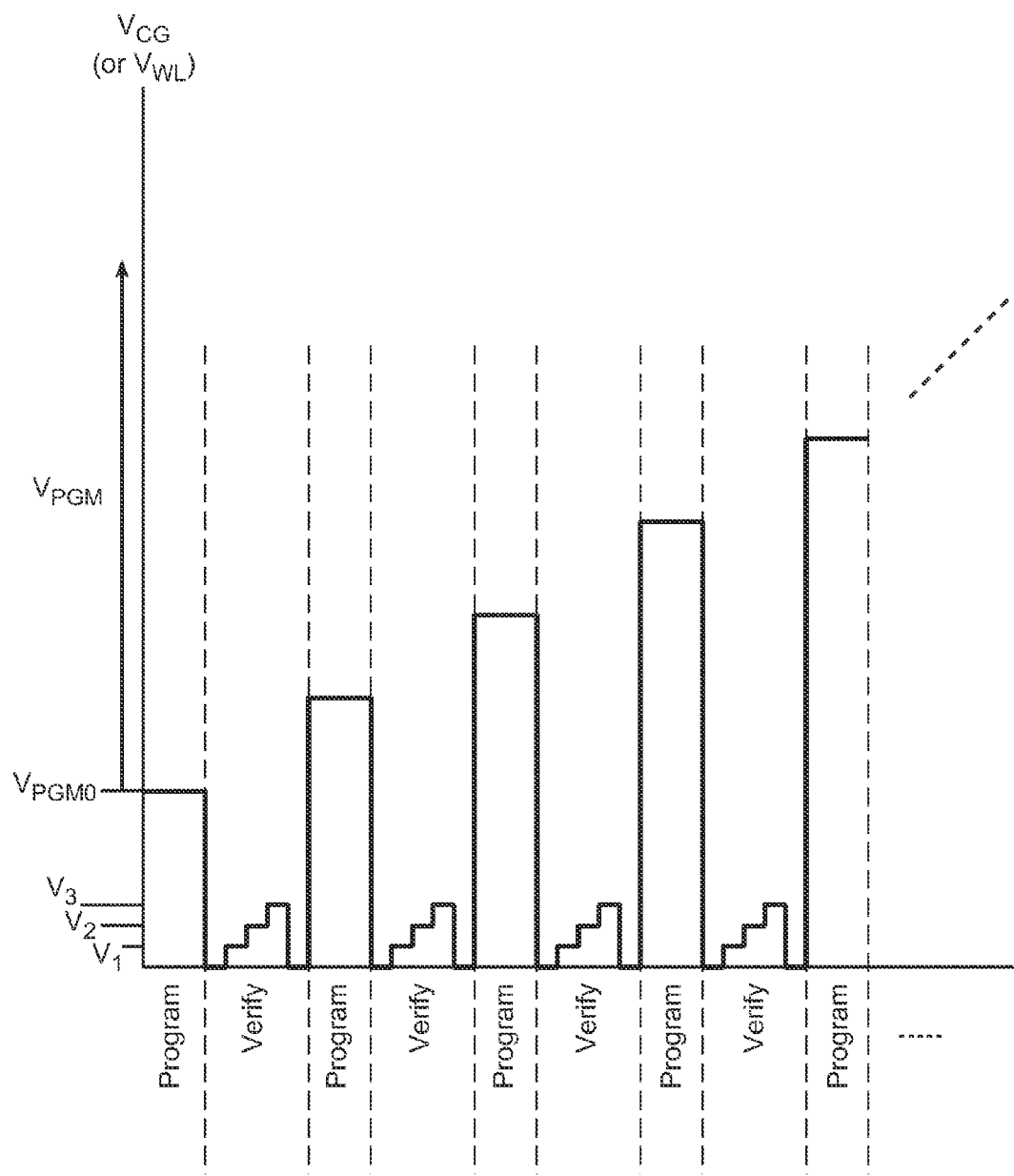
FIG. 13 illustrates a conventional technique for programming a 4-state memory cell.

FIG. 13 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified. (To enable programming, the corresponding bit line is set to a low value (typically VSS or ground), and to inhibit a cell from programming bit line is raised to higher level by the sense amp, typically VDD or VDDSA, as described in more detail in US patent publication number 2014-0003157, for example.)

In the write process, memory cells can experience a threshold voltage (Vt) downshift due to fast de-trapping that can occur right after program. De-trapping happens when some of the electrons taken into the memory cell during programming come back out of the charge storage medium or, more typically, are trapped in the tunnel dielectric between the substrate and the charge storage medium during programming and then de-trap back to the substrate. This situation can be illustrated in the context of an NAND embodiment with reference to FIG. 14.

Figure 14:
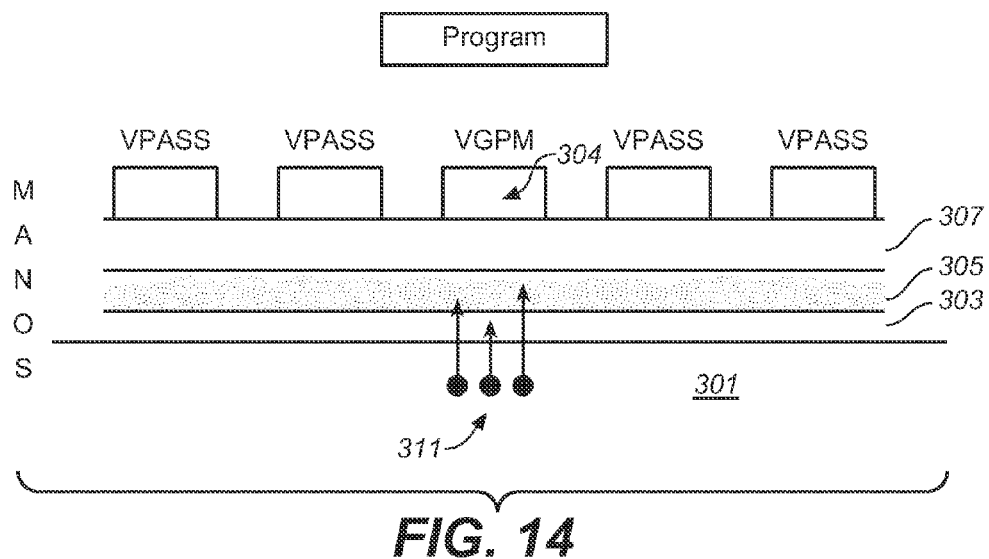
FIG. 14 shows a cross-section of a short segment of a NAND string to illustrate a programming mechanism.

The example of FIG. 14 shows a short segment of a NAND string, where the metal layer ("M") of five control gates over a silicon substrate ("S") 301, where the memory corresponding to the cell selected for programming in the center (309) and two non-selected cells to either side. A dielectric charge storage layer 305 (such as of nitride, "N") is formed a tunnel dielectric 303 (such as an oxide "O") and is separated from the metal layers by a dielectric layer 307 (such as aluminum oxide, "A"). In a programming operation, the non-selected word lines are set at the pass voltage VPASS and the selected word line at 309 has a series of pulses of VPGM applied. This pulls the electrons, represented by the three noted at 311, to by pulled up (to varying degrees) toward the control gate and into the dielectric layers, affect the threshold voltage of the corresponding transistor. The electrons represented at left and right both make it into the charge trapping dielectric N 305. The center electron, however, is not fully integrated, being trapped in the tunnel dielectric O 303. As long as this center electron stays lodged in the tunnel dielectric, it will affect the transistors threshold, but as it is relatively weakly trapped, it may de-trap and lower the cells Vt level. If this happens relatively quickly, prior to cell verifying at its target state, it will not particular affect the writing of the cell. If the de-trapping occurs after a verify operation has passed, though, the reliability of the program operation is affected.

Figure 15:
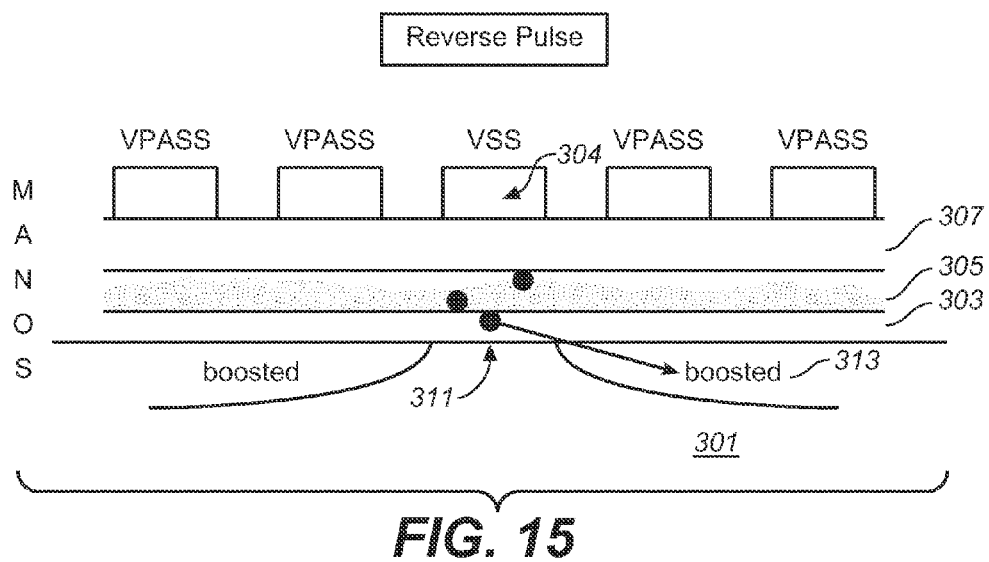
FIG. 15 illustrates de-trapping for the cross-section of FIG. 14.

One counter measure to deal with this is a reverse/counter pulse that is applied between program pulse and program verify sensing, to expedite the de-trapping process so that the correct program verify result is obtained. An exemplary embodiment of a de-trap operation is illustrated with respect to FIG. 15, which is labelled the same as in FIG. 14. After the programming pulse is applied as illustrated in FIG. 14, the non-selected word lines can be kept at VPASS and other bias levels (select gates, bit line, source line) can also be kept as for the program. The selected word line, however, has its voltage pulled down to a low value, in this example ground (VSS). This puts the control gate at a low voltage, but leaves the channel boosted to either side. If an electron is only weakly trapped, as for the center electron at 311, this can cause it to de-trap by being pulled into the boosted region 313.

Figure 16:
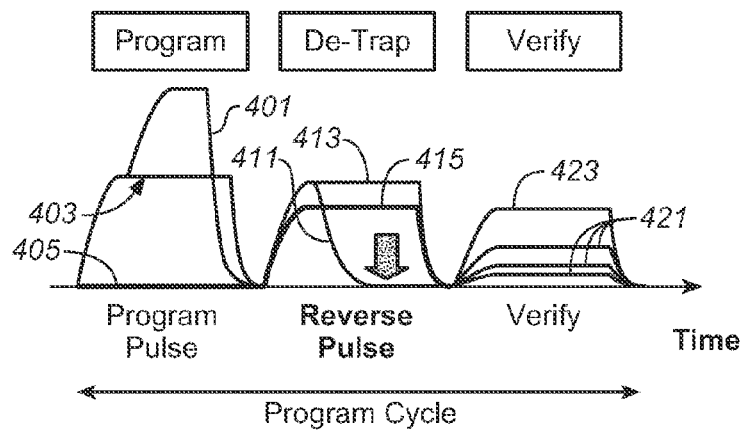
FIG. 16 shows one program cycle (one loop of a write operation) that incorporates a reverse pulse, de-trapping phase.

Although this can help the de-trapping problem, this additional reverse/counter pulse will incur additional program performance penalty as an additional pulse is required for each program loop. This can be illustrated with reference to FIG. 16 that shows one program cycle (one loop of a write operation) of a NAND-type memory incorporates a reverse pulse. The programming phase can be as usual, where the selected word line is pulsed with the high programming voltage at 401, corresponding to one step of the stair case in FIG. 13, while the non-selected word lines are at the pass voltage (403) and the channel is low (405) when programming, due to a combination of the bit line being set low (VSS for program enable) and the select gate and word line biases. Here the other bias levels (select gates, bit lines, and so on) are not shown to simplify the figures. During the verify phase, the non-selected word lines are set at the corresponding read voltage (423), while the selected word line is at one of the verify levels, represented variously at 421. In between is the de-trap operation: the non-selected word lines are again taken to the pass voltage (413); the channel is raised (415) by taking the bit line to the program inhibit level (shutting the drain side select gate) and being pulled by the non-selected word lines; and the selected word line is initially taken to the Vpass level, then taken to ground (411) as described with respect to FIG. 15. The reverse pulse serves to de-trap cells, making the programming result more stable, with limited lower tail bits in the state distribution, but at the cost of a timing penalty of something like a 50% increase in programming performance. This section presents a programming scheme that addresses the de-trapping issue while minimizing the program performance penalty.

More specifically, the programming cycle incorporates two pulses: one from the lower steps of the staircase to program the lower lying states, while the cells to be programmed to the higher states are inhibited; and one from the upper steps of the staircase to program the higher lying states, while the (unverified) lower states are inhibited. This is followed by a de-trap operation and a verify, common to both sets of cells. By utilizing multiple-program pulses per program cycle, this can lower the number of required reverse pulses (by reducing the overall program loop count number). This separates the program pulses for lower states (e.g. A, B, C, D) and upper states (e.g. E, F, G), but done within the same program cycle (shared reverse pulse). (Here, for this 3-bit per cell example, the non-erased states are split into two set, but different number of program pulse-state combinations can also be done, such three sets (A, B, C; D, E; F, G) or even as many as one set per state.) Overall, the individual program cycle will increase, but number of program loops decreases.

Figure 17:
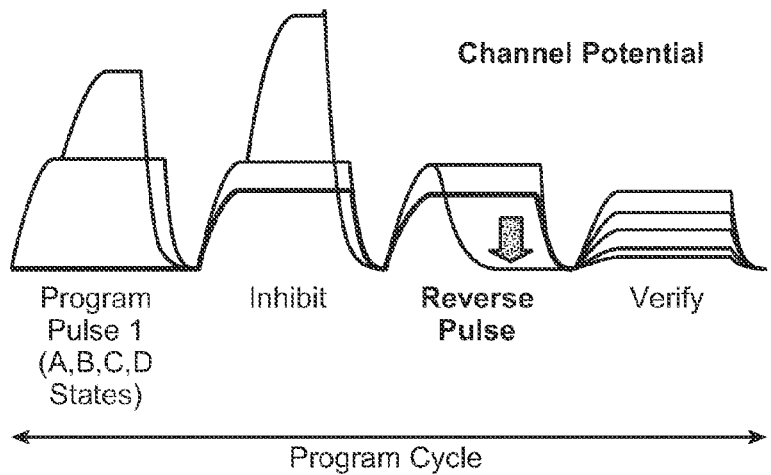
FIGS. 17 and 18 show one program cycle that incorporates multiple program pulses and a reverse pulse, de-trapping phase.
Figure 18:
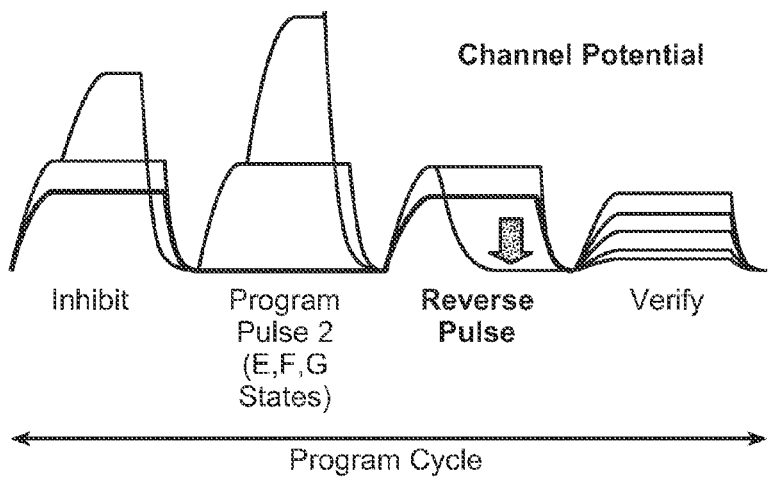

FIGS. 17 and 18 illustrate the process for the exemplary embodiment, where these are the same figure illustrating the same program cycle, but annotated differently, with FIG. 17 referring to the lower set of states (here A, B, C, D) and FIG. 18 referring to the higher set of states (E, F, G). As seen in FIG. 17 by a cell selected to programmed to a state from the lower set of states, the initial pulse of will look the same as in a normal program operation, followed by a de-trap operation as in FIG. 16 and a verify operation, except between the initial pulse and de-trap operations will be an addition pulse for which cells of this lower set will be de-selected. Similarly, as seen in FIG. 18 by a cell selected to programmed to a state from the upper set of states, the will look the same as in FIG. 16, except that the program cycle has an initial pulse cells of the upper set will be de-selected. (Any non-selected cells are program inhibited for both pulses.) Consequently, the bias levels of the two sets will need to be changed between pulses as which set is program inhibited and which is programmed enabled are swapped. The verify will also differ in that one or more states from each set will be verified in each cycle (assuming that not all the states of a set have locked out), where an example is illustrated in FIG. 20 as discussed below.

Under this arrangement, the number of reverse pulses decreases as the program loops decreases, which can increase write performance as well as lessen the amount of program disturb from the reverse pulses. The total number of consecutive verifies (across the different states) per cycle increases under this arrangement (although the total number of verifies over the complete write operation stays the same as in a conventional operation), reducing the number of times that the word lines need to ramp up and discharge. Additionally, there can be power/current savings, as there will be a lower device current (ICC) consumption as upper states are programmed to higher Vt from the beginning, without going through the lower steps of the programming waveform, and during initial program verifies, a larger proportion of the cells will be non-conducting.

FIG. 19 illustrates an example of the number of pulses and which states are verified for conventional full sequence program with a "smart" for 3-bit memory cell that incorporate a reverse pulse for de-trapping, a reverse pulse being included for each program loop. Initially, only the A state (lowest above erase) is included, with higher states being sequentially added in, while lower states are removed, over a series of 23 cycles.

FIG. 20 is an example corresponding to FIG. 19, but with the sort of two pulse per cycle arrangement as illustrated in FIGS. 17 and 18. In this case, as both sets are being programmed in each cycle, both sets are verified, starting with both the "A" state and the "E" state corresponding to the lowest state from each set. Both sequences then progress through the states of the two sets, concluding after 16 cycles. Although each cycle of the write operation is longer under this arrangement, the total number of cycles is reduced.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. In a non-volatile memory circuit having an array of non-volatile, multi-state memory cells, a method of performing a write operation on a plurality of memory cells formed along a first word line from a first state to one of a plurality of second states, the second states including a first subset of one or more memory states and a second subset of one or more memory states, where the threshold voltages of the states of the second subset are higher that the threshold voltages of the states of the first subset, the method comprising:
    performing a sequence of one or more programming cycles, a cycle comprising:
        applying a first programming pulse to the first word line while program inhibiting non-selected cells along the first word line, program inhibiting selected cells along the first word line to be programmed to a state of the second subset, and program enabling selected cells along the first word line to be programmed to a state of the first subset;
        subsequently applying a second programming pulse to the first word line while program inhibiting non-selected cells along the first word line, program inhibiting selected cells along the first word line to be programmed to a state of the first subset, and program enabling selected cells along the first word line to be programmed to a state of the second subset;
        subsequently performing a de-trap operation on the selected cells along the first word line of both subsets; and
        subsequently performing a verify operation the selected cells along the first word line of both sets, wherein those of the cells that successfully verify are inhibited prior to performing the nest cycle of the sequence.

2. The method of claim 1, wherein the verify operation includes one or more states from each of the first and second subsets.

3. The method of claim 1, wherein the array is formed according to a NAND type of architecture.

4. The method of claim 3, wherein while applying the first and second programming pulses to the first word line, other word lines of NAND strings having memory cells connected along the first word line are set to a pass voltage, and wherein a de-trap operation includes:
    while program inhibiting the selected cells of both sets, initially setting the first and other word lines to the pass voltage and subsequently setting the first word to ground while continuing to hold the other word line at the pass voltage.

5. The method of claim 3, wherein inhibiting a cell includes setting a corresponding bit line to a program inhibit voltage and program enabling a cell includes setting a corresponding bit line to a program enable voltage.

6. The method of claim 5, wherein the program enable voltage is ground and the program inhibit voltage is high sense amplifier operating level.

7. The method of claim 1, wherein the memory circuit is a monolithic three-dimensional semiconductor memory device where the memory cells are arranged in multiple physical levels above a silicon substrate and comprise a charge storage medium.

8. The method of claim 1, wherein the memory cells comprise a charge storage medium.

9. The method of claim 8, wherein the charge storage medium is a dielectric layer.

10. The method of claim 8, wherein the charge storage medium is a floating gate.

11. The method of claim 1, wherein the first and second subsets of memory states each include a plurality of memory states.

12. The method of claim 1, wherein the amplitude of the second programming pulse is greater than the amplitude of the first programming pulse.

13. The method of claim 1, wherein the first state is an erased state.

14. The method of claim 1, wherein the multi-state memory cells are operated to store 3 bits per cell.

15. The method of claim 1, wherein the first and second subsets each include a plurality of memory states.

* * * * *